United States Patent
Weimer et al.

(10) Patent No.: US 7,064,052 B2
(45) Date of Patent: Jun. 20, 2006

(54) METHOD OF PROCESSING A TRANSISTOR GATE DIELECTRIC FILM WITH STEM

(75) Inventors: Ronald A. Weimer, Boise, ID (US); Scott J. DeBoer, Boise, ID (US); Dan Gealy, Kuna, ID (US); Husam N. Al-Shareef, Al-Ain (AE)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/133,390

(22) Filed: Apr. 29, 2002

(65) Prior Publication Data

US 2002/0151107 A1     Oct. 17, 2002

Related U.S. Application Data

(62) Division of application No. 09/912,558, filed on Jul. 26, 2001, which is a division of application No. 09/296,835, filed on Apr. 22, 1999.

(51) Int. Cl.
*H01L 21/3205* (2006.01)

(52) U.S. Cl. .............. 438/591; 438/216; 257/410; 257/411

(58) Field of Classification Search .......... 438/591, 438/585, 216; 257/410, 411, 640, 649
See application file for complete search history.

(56) References Cited

U.S. PATENT DOCUMENTS

| | | | |
|---|---|---|---|
| 5,057,463 A * | 10/1991 | Bryant et al. ............. 438/762 |
| 5,244,843 A * | 9/1993 | Chau et al. ............... 438/452 |
| 5,374,578 A | 12/1994 | Patel et al. |
| 5,486,488 A | 1/1996 | Kamiyama |
| 5,508,221 A | 4/1996 | Kamiyama |
| 5,663,088 A | 9/1997 | Sandhu et al. |
| 5,726,083 A | 3/1998 | Takaishi |
| 5,728,603 A | 3/1998 | Emesh et al. |
| 5,817,581 A * | 10/1998 | Bayer et al. ............. 438/770 |
| 5,840,368 A * | 11/1998 | Ohmi ................... 427/255.4 |
| 5,926,741 A * | 7/1999 | Matsuoka et al. ......... 438/778 |
| 6,046,494 A * | 4/2000 | Brigham et al. ........... 257/640 |
| 6,063,698 A | 5/2000 | Tseng et al. |
| 6,066,581 A | 5/2000 | Chivukula et al. |
| 6,114,258 A * | 9/2000 | Miner et al. ............. 438/787 |

(Continued)

OTHER PUBLICATIONS

Wolf, et al. Silicon Processing for the VLSI Era, vol. 1-Process Technology, Lattice Press: Sunset Beach CA, 1986, pp. 57-58.*

(Continued)

*Primary Examiner*—Laura M. Schillinger
*Assistant Examiner*—Colleen E. Rodgers
(74) *Attorney, Agent, or Firm*—Dickstein Shapiro Morin & Oshinsky LLP

(57) ABSTRACT

A method of fabricating a semiconductor device includes depositing a dielectric film and subjecting the dielectric film to a wet oxidation in a rapid thermal process chamber. The technique can be used, for example, in the formation of various elements in an integrated circuit, including gate dielectric films as well as capacitive elements. The tight temperature control provided by the RTP process allows the wet oxidation to be performed quickly so that the oxidizing species does not diffuse significantly through the dielectric film and diffuse into an underlying layer. In the case of capacitive elements, the technique also can help reduce the leakage current of the dielectric film without significantly reducing its capacitance.

6 Claims, 8 Drawing Sheets

U.S. PATENT DOCUMENTS

| | | | |
|---|---|---|---|
| 6,124,154 A | * | 9/2000 | Miyasaka .................... 438/151 |
| 6,184,155 B1 | * | 2/2001 | Yu et al. ...................... 438/763 |
| 6,197,668 B1 | | 3/2001 | Gardner et al. |
| 2001/0020725 A1 | | 9/2001 | Okuno et al. |

OTHER PUBLICATIONS

Van Zant, Microchip Fabrication, 4th ed. McGraw-Hill: New York, 1984, p. 172.*

Ghandi, VLSI Fabrication Principles, John Wiley & Sons: New York, 1994, p. 465.*

Ghandi, VLSI Fabrication Principles, 2nd ed., John Wiley & Sons: New York, 1994, pp. 466-470.*

Lu, et al., "Leakage Current Comparison Between Ultra-Thin $Ta_2O_5$ films and conventional gate dielectrics" IEEE Electron Device Letters 19(9), Sep. 1998, pp. 341-342.

Alers, et al., "Intermixing at the Tantalum Oxide/Silicon Interface in Gate Dielectric Structures" Applied Physics Letters 73(11), Sep. 14, 1998, pp. 1517-1519.

Luan, et al. "Ultra-thin High Quality $Ta_2O_5$ Dielectric Prepared by In-Situ Rapid Thermal Processing" Electron Devices Meeting, held Dec. 6-9, 1998, IEDM '98 Technical Digest, pp. 609-612.

* cited by examiner

METHOD OF PROCESSING A TRANSISTOR GATE DIELECTRIC FILM WITH STEM

This application is a divisional of application Ser. No. 09/912,558, filed on Jul. 26, 2001, which is a divisional of application Ser. No. 09/296,835, filed on Apr. 22, 1999, which are incorporated herein by reference.

BACKGROUND

The present invention relates generally to semiconductor devices and, more particularly, to the formation of a dielectric film using a wet rapid thermal oxidation process.

Insulating materials, such as dielectrics, used in semiconductor devices are selected based on their electrical or other properties and their intended use. For example, a typical DRAM device can include a first area assigned to a memory cell array and a second area assigned to peripheral circuits. The memory cells in the cell array include a transistor coupled in series with a stacked-type or other storage capacitor. The transistor includes a gate dielectric layer such as an oxide. The storage capacitor, which stores charge to represent data, also includes a dielectric material disposed between two electrodes.

It often is desirable to select a dielectric material having a high dielectric constant for enhanced capacitance. For example, a tantalum oxide ($Ta_2O_x$) film formed by chemical vapor deposition (CVD) has a high dielectric constant ($\in_r$) of about 25 to 30. Such a film can provide good step coverage and can be fabricated relatively easily compared to other insulating films having high dielectric constants. The tantalum oxide film typically is deposited as an oxygen-deficient oxide, and such oxygen deficient films typically are leaky. To improve the leakage current properties of the tantalum oxide film, an oxidizing treatment can be performed following deposition of the film.

Some oxidation processes are performed at elevated temperatures for an extended duration which can result, for example, in the diffusion of oxidizing species through the dielectric layer so that more oxygen is incorporated into the insulating film. This results in a better insulating film. Other defects, however, such as pinholes, can result in leakage current and, therefore, in an insulating film having a breakdown voltage that is not as high as desirable. Dielectric films with such defects do not have sufficiently high capacitance for the memory cells required for DRAMs of 256 megabits and larger. Thus, it is desirable to improve the techniques for enhancing the properties of tantalum oxide and other dielectric films used in DRAM and other semiconductor devices.

SUMMARY

In general, a method of fabricating a semiconductor device includes depositing a dielectric film and subjecting the dielectric film to a wet oxidation in a rapid thermal process chamber. The technique can be used, for example, in the formation of various elements in an integrated circuit, including gate dielectric films as well as capacitive elements.

In one particular aspect, a method of fabricating a semiconductor device includes depositing a dielectric film over an active region of a semiconductor substrate to form a gate of a transistor and subjecting the dielectric film to a wet oxidation in a rapid thermal process chamber. For example, steam can be provided to a vicinity of the dielectric film while the substrate with the dielectric film is in the rapid thermal process chamber.

Similarly, according to another aspect, a method of fabricating a capacitive element includes forming a lower electrode of the capacitive element. A dielectric film is deposited over the lower electrode and is subjected to a wet oxidation in a rapid thermal process chamber, for example, by providing steam to a vicinity of the dielectric film. An upper electrode then is formed over the dielectric film.

Various implementations include one or more of the following features. The dielectric film initially deposited can be an oxygen-deficient film and can include a material having a dielectric constant of at least about 25. Exemplary dielectric materials that can be deposited include tantalum oxide, silicon nitride, barium strontium titanate, strontium titanate, lead zirconium titanate and strontium bismuth tantalate, among others. In some implementations, the dielectric film is deposited by chemical vapor deposition.

One of several techniques can be used to provide steam to a vicinity of the insulating film. Such techniques include using a bubbled water vapor system, a pyrogenic system or a catalytic system, or generating steam in the chamber in situ.

The temperature, duration and amount of steam can be selected to optimize the oxidation process to obtain a film that is less prone to leakage. For example, in some implementations, the temperature in the rapid thermal process chamber can be about 450° C. or higher. In general, the wet rapid thermal oxidation can be performed for a duration such that the oxidizing species does not diffuse significantly through the film. In particular, the duration can be selected so that the oxidizing species does not significantly affect the capacitive and other properties of the insulating film and so that it does not oxidize films under the insulating dielectric. Exemplary durations are on the order of only several minutes, and typically can be as short as less than one minute.

In some implementations, it is also desirable to subject the insulating film to a heat treatment in an ambient comprising a stabilizing gas such as nitrogen, oxygen, nitrogen oxide, or nitrous oxide. The heat treatment can help crystallize or otherwise stabilize the electrical and other properties of the film. The heat treatment can be performed either prior to or after subjecting the insulating film to the wet oxidation. In some cases, the heat treatment also is performed in a rapid thermal process chamber.

One or more of the following advantages are present in some implementations. Performing a wet oxidation process in an RTP chamber to condition the dielectric film can help reduce the leakage current of the film without significantly reducing its capacitance. In particular, the tight temperature control provided by the RTP process allows the wet oxidation to be performed quickly so that the oxidizing species does not diffuse significantly through the dielectric film and reduce or adversely affect the capacitance of the structure.

With respect to the formation of gate dielectric films, using materials which have relatively high dielectric constants allows the gate dielectric to be made relatively thick and yet still provide a capacitance whose value is similar to thinner gates. The thicker dielectric layer can help reduce the adverse affects of gate hardening caused, for example, by boron penetration. Furthermore, the oxygen content of the as-deposited film can be increased by subjecting the film to the wet RTP oxidation. The electrical properties of the gate dielectric film can, thus, be enhanced.

Other features and advantages will be readily apparent from the following detailed description, the accompanying drawings, and the claims.

DETAILED DESCRIPTION

Figure 1:
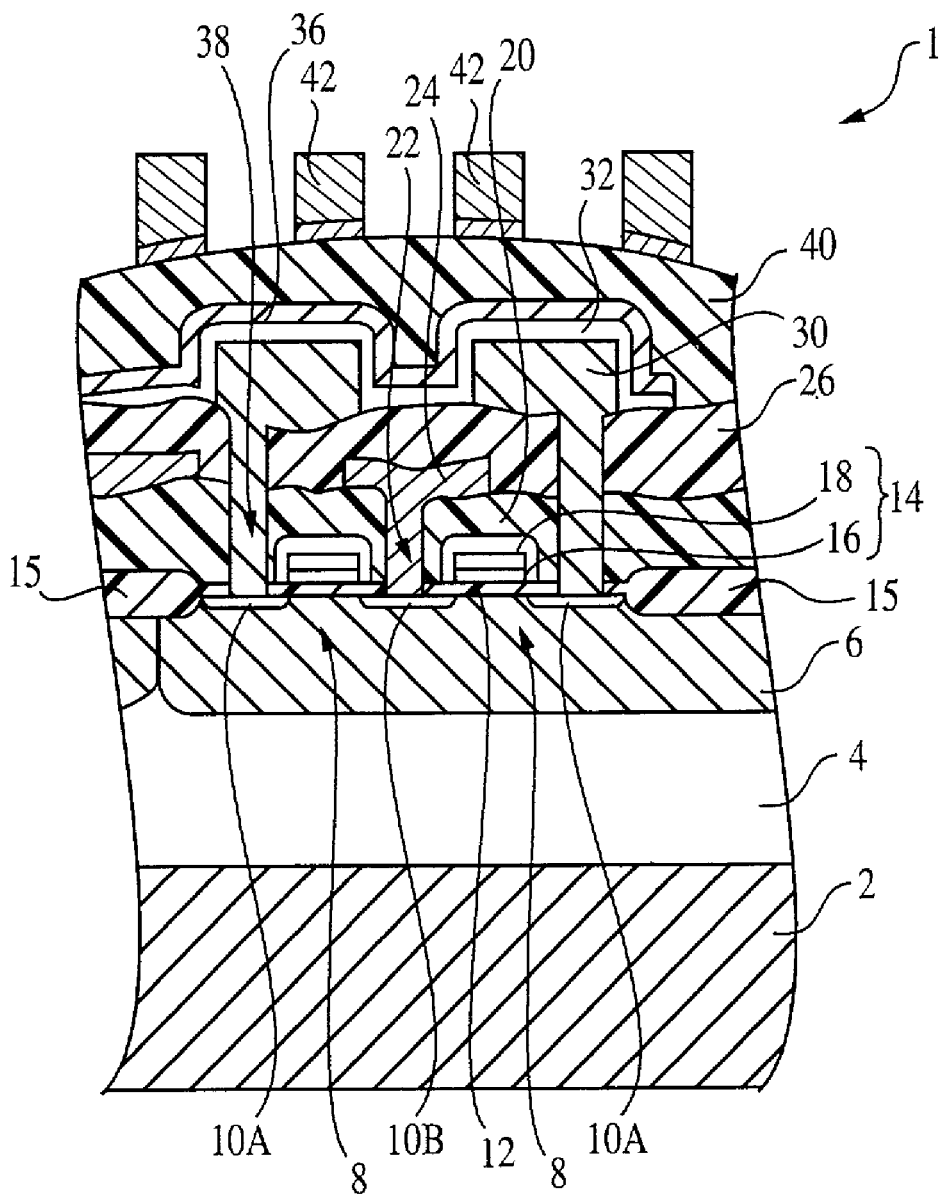
FIG. 1 is a cross-section of an exemplary semiconductor device according to the invention.

Referring to FIG. 1, an exemplary semiconductor memory device 1 includes an n-type well 4 formed in a p-type silicon substrate 2, and a p-type well 6 formed in the n-type well 4. At the surface of the p-type well 6, a pair of transistors 8 are formed and constitute a memory cell of the memory device 1. Each of the transistors 8 includes n-type source/drain regions 10A, 10B, a gate dielectric film 12, and a gate electrode 14. The gate electrode 14 can include a polycrystalline silicon film 16 and a silicide film 18 stacked above the gate dielectric film 12. Field oxide regions 15 separate the transistors 8 from other devices formed on the semiconductor wafer.

Each transistor 8 is covered with a first interlayer insulating film 20. A contact hole 22 is formed through the insulating film 20 and reaches the source/drain region 10B common to the pair of transistors 8. A bit line 24 is connected to the source/drain region 10B through the contact hole 22.

The bit line 24 is covered with a second interlayer insulating film 26. Capacitive elements are formed above the insulating film 26. The stacked-type capacitive elements include a lower electrode 30, a capacitor insulating film 32, and an upper electrode 36. Each of the paired lower electrodes 30 is electrically connected to a respective one of the source/drain regions 10A through contact holes 38 which extend through the first and second interlayer insulating films 20, 26.

The capacitive elements are covered with a third interlayer insulating film 40, and electrodes 42 are provided on the surface of the third interlayer insulating film.

Figure 2:
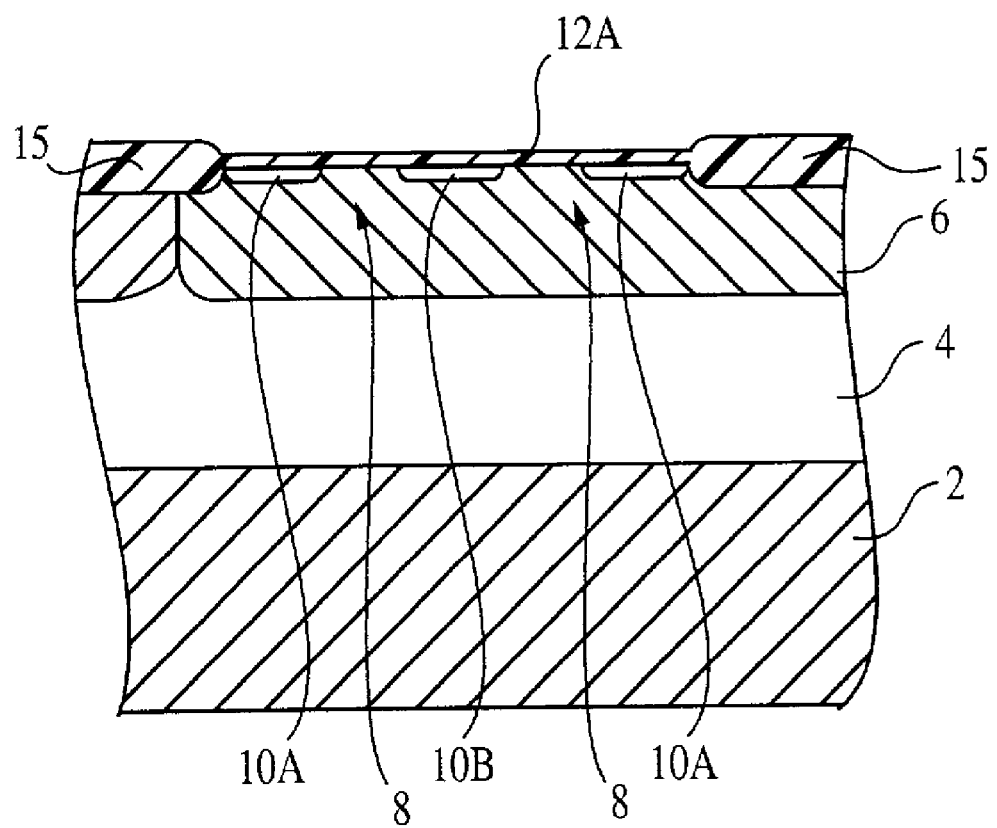
FIGS. 2 and 3 are cross-sectional diagrams illustrating details for fabricating a gate insulating layer according to the invention.
Figure 3:
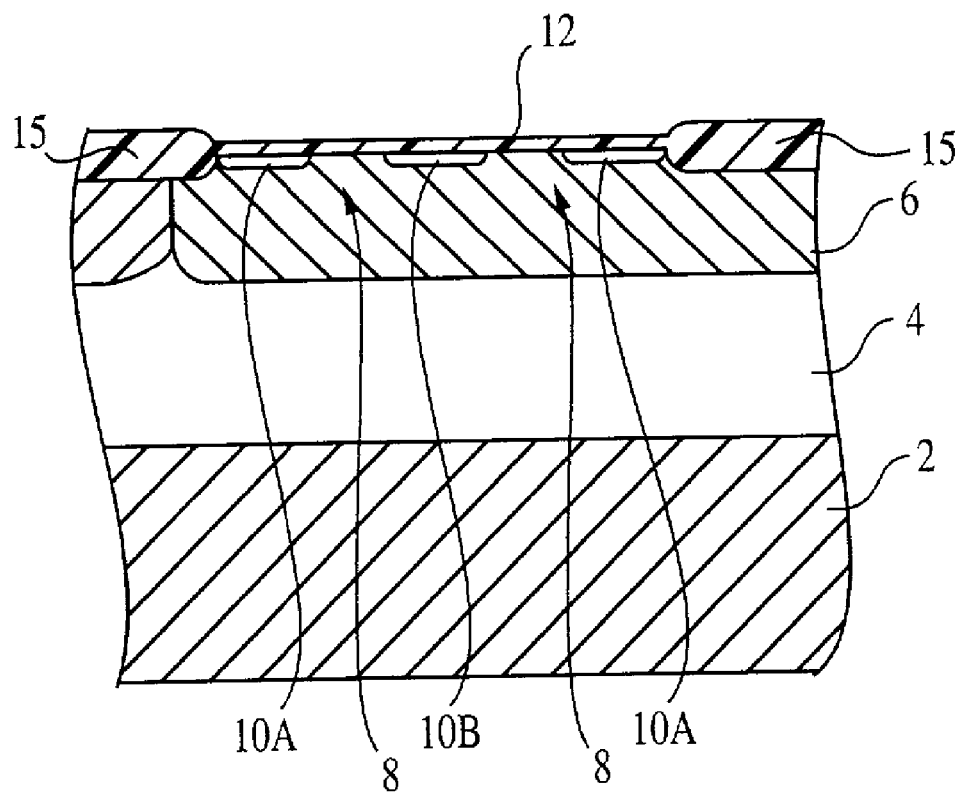

Further details for fabricating the gate insulating layer 12 are described with reference to FIGS. 2 and 3. Referring to FIG. 2, a dielectric film 12A is formed over the surface of the semiconductor wafer, for example, by a CVD process. Preferably, the dielectric film has a relatively high dielectric constant $\in_r$. For example, a low pressure CVD apparatus with a source gas comprising pentaethoxyltanatalum (Ta $(OC_2H_5)_5$) gas and oxygen can be used to form a tantalum oxide ($Ta_2O_x$) film 12A having a dielectric constant $\in_r$ of about 25 to 30. The deposited film 12A can be either an amorphous or crystalline film. In other implementations, a silicon nitride ($Si_xN_y$) film can be deposited as the film 12A.

After the dielectric film 12A is deposited or grown, the film is subjected to a densifying treatment by which a film 12 (FIG. 3) is formed. The densifying treatment includes heating the semiconductor wafer to stabilize and/or crystallize the film 12A and includes subjecting the wafer to a wet oxidation in a rapid thermal process (RTP) chamber. The wet RTP oxidation process helps raise the oxygen content of the resulting film 12. If $Si_xN_y$ is used as the film 12A, then the wet RTP oxidation treatment will result in a silicon oxynitride film 12.

Using materials such as tantalum oxide or silicon nitride which have relatively high dielectric constants allows the gate insulating layer to be made thicker than the typical 30–40 Å and yet still provide a capacitance whose value is similar to the thinner gate layers. The thicker insulating layer also can help reduce the adverse affects of gate hardening caused by boron penetration. Furthermore, the oxygen content of the as-deposited film 12A can be increased by subjecting the film 12A to the wet RTP oxidation. The electrical properties of the film can, thus, be enhanced.

Figure 4:
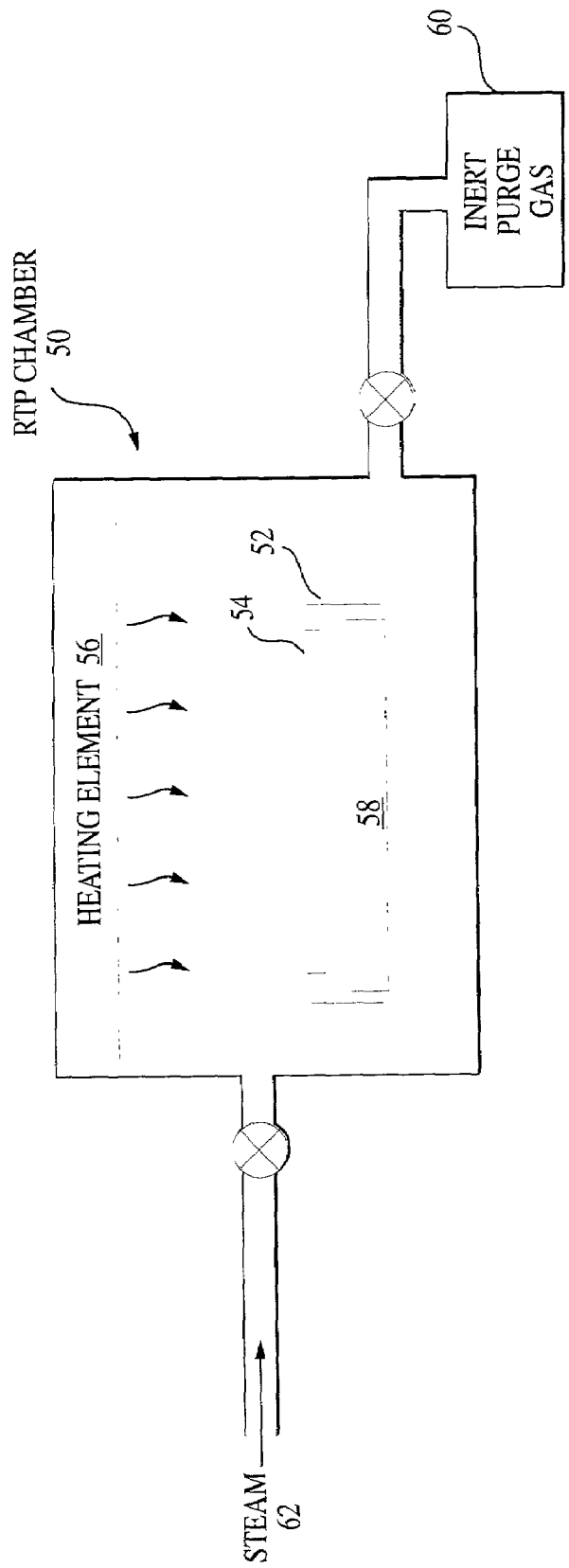
FIG. 4 illustrates an exemplary rapid thermal process (RTP) chamber for use in the present invention.

Referring to FIG. 4, an exemplary RTP chamber 50 for use in the foregoing technique includes a substrate support structure 52. A semiconductor wafer 54 with the insulating film 12A formed thereon is mounted on the support structure 52 and is heated by a heating element 56 located above the wafer. A reflector 58 mounted beneath the wafer 54 forms a reflecting cavity for enhancing the emissivity of the wafer. During processing, an inert gas 60 such as argon (Ar) can be provided to the chamber interior to help purge the chamber 50. Steam 62 for the wet oxidation can be provided from a source external to the chamber 50 or can be generated in situ within the chamber. Using an RTP process for the wet oxidation provides precise temperature control and allows oxidation of the film 12A to be performed quickly. In some implementations, the RTP chamber 50 in which the wet oxidation is carried out is part of a cluster system.

The steam for the wet oxidation can be provided to the interior of the RTP chamber in the vicinity of the film 12 in various ways. For example, a bubbled water vapor technique can be used in which a water reservoir external to the interior of the RTP chamber is heated to generate steam. The steam then is carried to the interior of the chamber 50 by a carrier gas such as Ar.

Alternatively, a pyrogenic system can be used in which hydrogen ($H_2$) and oxygen ($O_2$) gases are mixed together and heated by a torch to form steam or water vapor. The vapor then is carried to the chamber interior via a duct.

In yet other embodiments, a catalytic system can be used to generate steam or water vapor from a mixture of $H_2$ and $O_2$ gases. Platinum or another noble metal can be used as the catalyst.

According to another embodiment, an in situ steam generation process is used in which $H_2$ and $O_2$ gases are mixed within the chamber 50. Heat from the wafer 50 can serve as the catalyst for forming steam in the vicinity of the wafer.

If a mixture of $H_2$ and $O_2$ gases is used to form the steam, suitable ratios of $H_2$ gas to $O_2$ gas are in the range of about 0.1 to about 0.80. In general, the higher the ratio of $H_2$ gas to $O_2$ gas, the more aggressive is the oxidation process. The ratio of steam relative to other gases in the chamber 50 should be at least as high as 0.005, and preferably is in the range of about 0.1 to about 0.5, although lesser or greater amounts also can be used.

In various implementations, temperatures in the range of approximately 450° C. to about 1050° C. are suitable for the RTP process. More specifically, temperatures greater than about 600° C. are desirable, as are temperatures in the range of about 750° C. to about 950° C., particularly for crystalline films. For non-crystalline films, however, a lower temperature in the range of about 450° C. to about 750° C. can be used. The optimal pressure in the chamber will vary depending on the particular RTP system and wet oxidation technique used. In general, the pressure can be at about atmospheric pressure, although if the $H_2$ and $O_2$ gases are combined in the chamber 50, then the pressure should be kept lower, for example, around 1 millitorr. The wet oxidation can be performed for as short a duration as a spike anneal or as long as several minutes. Preferably, however, the wet oxidation lasts for a duration in the range of about twenty to sixty seconds.

Figure 8:
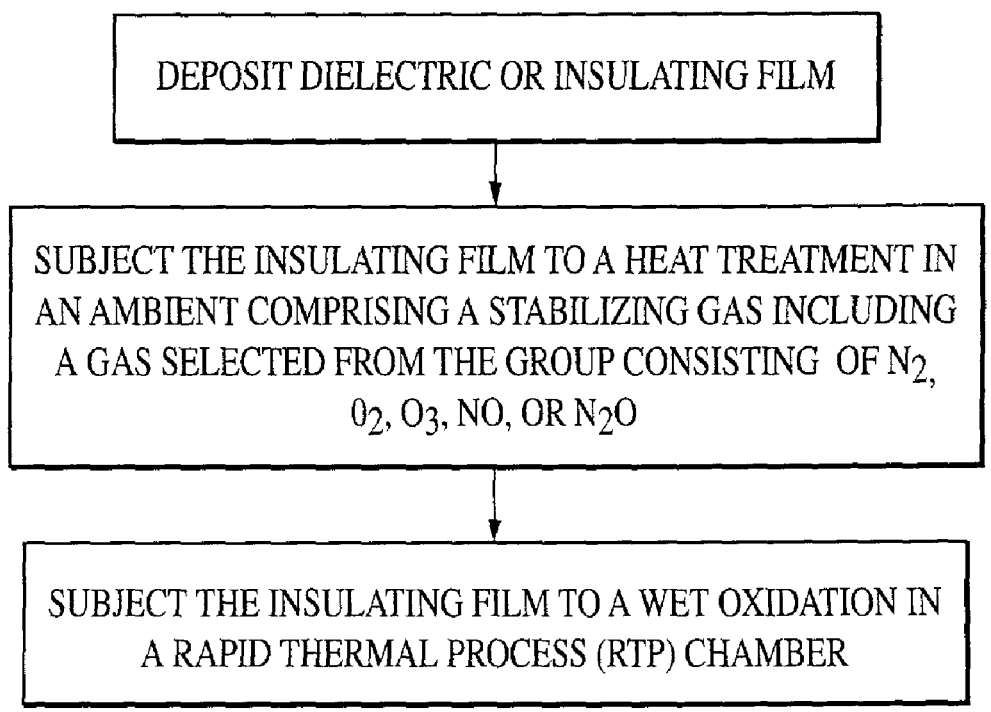
FIG. 8 is a flow chart showing various steps of conditioning an insulating film according to the invention.

In some cases it also may be desirable to subject the gate dielectric film 12 to a heat treatment in an ambient comprising a stabilizing gas. Such as heat treatment in the presence of a stabilizing gas can be performed either prior to or subsequent to the wet RTP oxidation process. Further details of the heat treatment using a stabilizing gas are discussed below with reference to FIG. 8.

Following formation of the gate dielectric film 12, the gate electrodes 14, the first interlayer insulating film 20, the contact hole 22, the bit line 24, the second interlayer insulating film 26, and the contact hole 38 can be formed using known techniques.

Once the second interlayer insulating film 26 and the contact hole 38 are formed, a polycrystalline silicon film is deposited, for example, using a CVD process. The polycrystalline film can be doped with phosphorous and patterned to form the lower electrode 30. A rapid thermal nitriding treatment then can be performed to form a silicon $Si_xN_y$ over the polycrystalline film.

In general, the techniques described above with respect to the gate dielectric film 12 also can be used to form the insulating film 32 for the capacitive elements. Preferably, the film 32 includes a material with a relatively high dielectric constant $\in_r$. Suitable materials include, among others, $Ta_2O_x$, $Si_xN_y$, barium strontium titanate ($Sr_xBa_{1-x}TiO_3$), strontium titanate ($SrTiO_3$), lead zirconium titanate ($PbZrTiO_3$) and strontium bismuth tantalate ($Sr_xBi_yTa_zO_3$). For example, as previously noted, $Ta_2O_x$ has a dielectric constant of about 25 to 30. $Sr_xBa_{1-x}TiO_3$ can have a dielectric constant as high as about 300, although the polar nature of $Sr_xBa_{1-x}TiO_3$ may make it somewhat less desirable for some applications.

Figure 5:
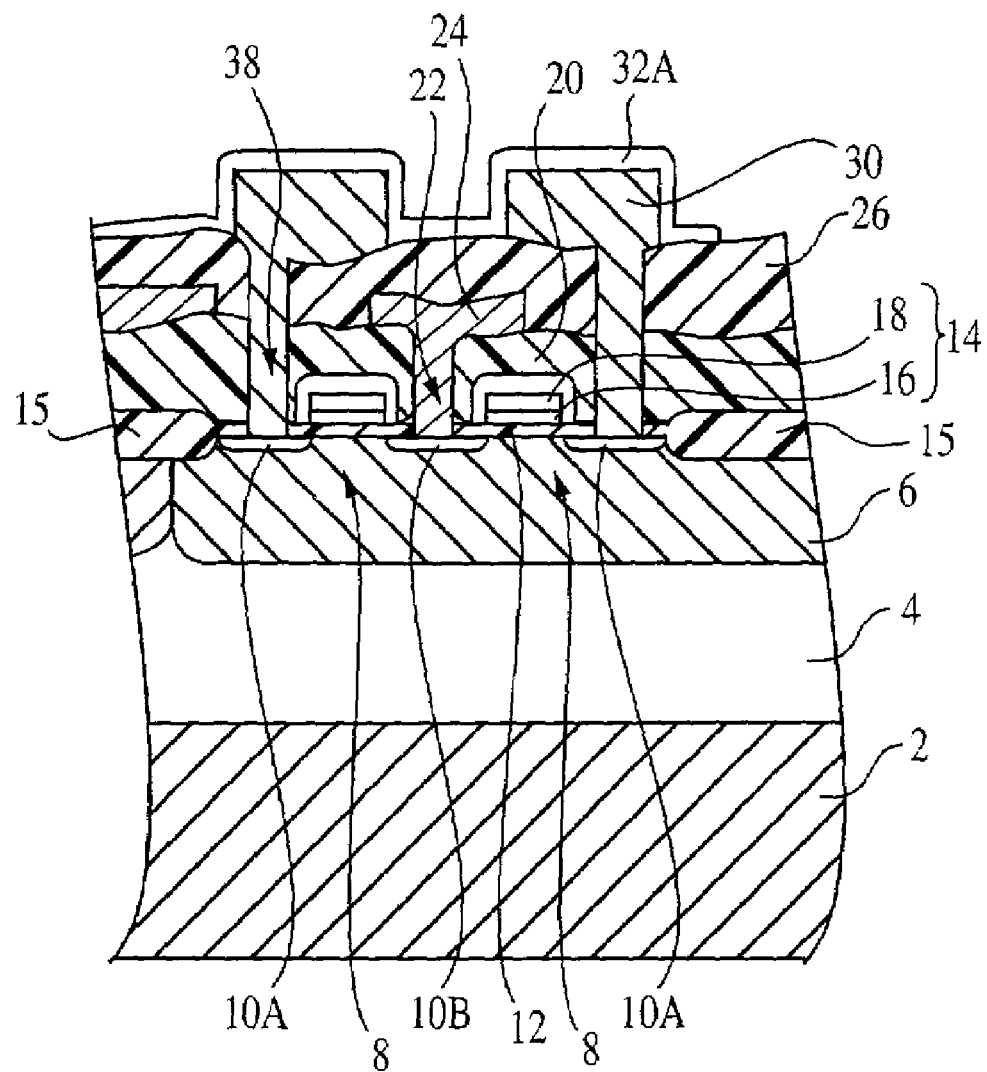
FIGS. 5 through 7 are cross-sectional diagrams illustrating details for fabricating capacitive elements of the memory device according to the invention.

In one exemplary implementation, a tantalum oxide film 32A (FIG. 5) is formed over the surface of the interlayer insulating film 26 including the surface of the lower electrode 30 by a CVD process. As described above, a low pressure CVD apparatus with a source gas comprising pentaethoxyltantalum ($Ta(OC_2H_5)_5$) gas and oxygen can be used to form the tantalum oxide film 32A. The deposited tantalum oxide film 32A can be either an amorphous or crystalline film. The thickness of the film 32A can be in the range of several angstroms (Å) to several hundred Å, and should be optimized to obtain a desired capacitance.

Figure 6:
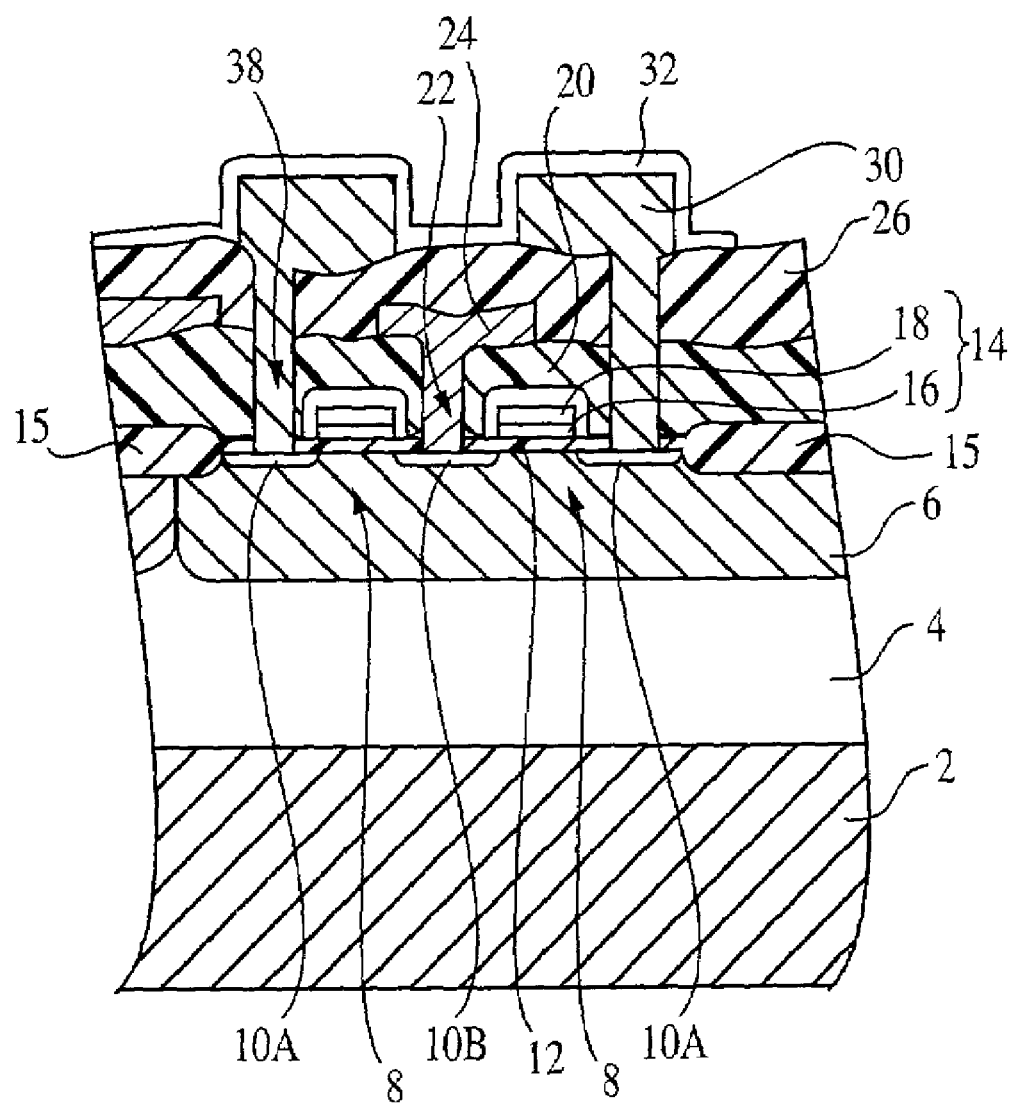

After the film 32A is deposited, it is subjected to a densifying treatment by which the oxide film 32 (FIG. 6) is formed. The densifying treatment includes heating the semiconductor wafer to stabilize and/or crystallize the film 32A and includes subjecting the wafer to a wet oxidation in a rapid thermal process (RTP) chamber. Performing a wet oxidation process in an RTP chamber to form the film 32 can help reduce the leakage current of the dielectric film without significantly reducing its capacitance. In particular, the tight temperature control provided by the RTP process allows the wet oxidation to be performed quickly so that the oxidizing species does not diffuse significantly through the dielectric film and distort the capacitance.

The RTP chamber 50 described above can be used to perform the wet oxidation of the film 32A. Furthermore, the various techniques described above for providing steam to the RTP chamber interior with respect to formation of the gate dielectric film 12 also can be used to form the capacitive dielectric film 32. In particular, the steam for the wet oxidation of the film 32A can be provided to the interior of the RTP chamber using a bubbled water vapor technique, a pyrogenic system, or a catalytic system. Alternatively, an in situ steam generation process can be used. The various process parameters, such as temperature, pressure, and mixtures of gases, discussed above with respect to formation of the gate dielectric 12 can be used during wet oxidation of the film 32A as well.

In some applications, the RTP process performed for the wet oxidation is sufficient to stabilize the gate dielectric film 12 or the film 32 as desired. For example, if an amorphous film 12 or 32 is desired, the wet RTP oxidation may suffice. However, in some cases, it is desirable to subject one or both of the films 12, 32 to a heat treatment in an ambient having a stabilizing gas comprising nitrogen ($N_2$), oxygen ($O_2$ or $O_3$) nitrogen oxide (NO), or nitrous oxide ($N_2O$) just prior to or after performing the respective RTP wet oxidation (see FIG. 8). Such a stabilizing process can be used, for example, to obtain a crystalline film. Although the stabilizing process can be performed in a separate furnace, performing the stabilizing process in the same or a different RTP chamber can provide tighter temperature control. The total time required for conditioning the dielectric film 12 (or 32) using the RTP process can be on the order of several minutes per wafer.

In some implementations, the stabilizing process can is performed while the temperature in the RTP chamber is brought to the temperature for the wet oxidation. The wet oxidation should be performed at a temperature slightly less than the temperature for the stabilizing process so that the properties of the film 12 (or 32) obtained during the stabilizing process are not adversely affected by the subsequent RTP wet oxidation. Thus, in one implementation, the dielectric film 32A initially is subjected to an ambient comprising $N_2$ at a temperature greater than about 750° C. The wet RTP oxidation subsequently is performed at a temperature in the range of about 500 to 700° C. In an alternative embodiment, the film 32A initially is subjected to the wet RTP oxidation at a temperature in the range of about 500 to 700° C. Subsequently, the oxidized film 32 is subjected to dry $N_2$ or $O_2$ at a temperature greater than about 700° C. As previously mentioned, the wet oxidation combined with the higher temperature stabilization can be used to form a crystalline dielectric film.

Figure 7:
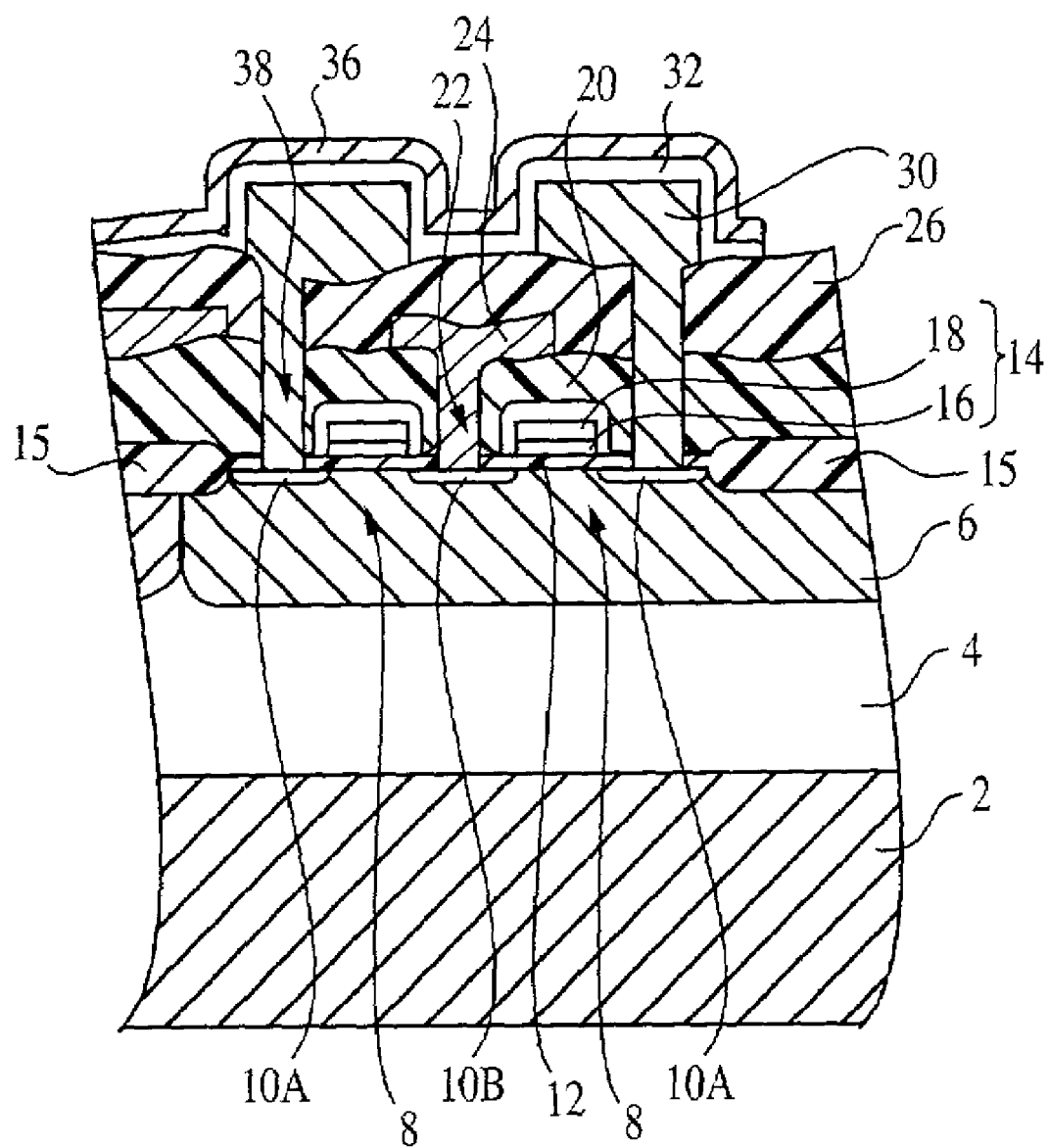

Once the densification process for the film 32 is complete, the upper electrode 36 is formed, for example, by depositing and patterning a titanium nitride film as shown in FIG. 7.

Although the techniques have been described with respect to memory cells such as DRAMs, the techniques also can be used with other semiconductor devices incorporating insulating or dielectric films, particularly where the as-deposited insulating film is oxygen deficient or more leaky than desired. The foregoing techniques can be used to enhance the oxygen content of the as-deposited dielectric film without adversely affecting other electrical properties of the film or the interface between the dielectric film and an underlying layer.

Other implementations are within the scope of the following claims.

What is claimed is:

1. A method of processing a transistor gate dielectric film, the method comprising:
   depositing said transistor gate dielectric film layer over an active region of a semiconductor substrate, wherein said transistor gate dielectric film has a dielectric constant of at least about 25;

providing an ambient comprising steam to a vicinity of the transistor gate dielectric film layer while the substrate undergoes a first heat treatment in a rapid thermal process chamber at a temperature greater than about 450° C.; and subjecting the transistor gate dielectric film to a second heat treatment in an ambient comprising at least one gas selected from the group consisting of $N_2$, $O_2$, $O_3$, NO, and $N_2O$.

2. The method of claim 1 wherein the steam is provided to the rapid thermal process chamber using a bubbled water vapor system.

3. The method of claim 1 wherein the steam is provided to the rapid thermal process chamber using a pyrogenic system.

4. The method of claim 1 wherein the steam is provided to the rapid thermal process chamber using a catalytic system.

5. A method of processing a transistor gate dielectric film, the method comprising:

depositing an oxygen-deficient transistor gate dielectric film layer over an active region of a semiconductor substrate;

providing steam to a vicinity of the oxygen-deficient transistor gate dielectric film layer while the substrate undergoes a first heat treatment in a rapid thermal process chamber with a mixture of hydrogen and oxygen gas at a temperature greater than about 450° C., wherein said mixture is a ratio from 0.1 to approximately 0.80 of hydrogen gas to oxygen gas; and subjecting the oxygen-deficient transistor gate dielectric film to a second heat treatment in an ambient comprising at least one gas selected from the group consisting of $N_2$, $O_2$, $O_3$, NO, and $N_2O$.

6. A method of processing a transistor gate dielectric film, the method comprising:

depositing a high-dielectric transistor gate film layer over an active region of a semiconductor substrate;

applying steam to a vicinity of the high-dielectric transistor gate film layer while the substrate undergoes a first heat treatment in a rapid thermal process chamber at a temperature from about 500° C. to less than 700° C., said steam comprising a mixture of hydrogen and oxygen gas; and subjecting the high-dielectric transistor gate film to a second heat treatment in an ambient comprising at least one gas selected from the group consisting of $N_2$, $O_2$, $O_3$, NO, and $N_2O$.

* * * * *

UNITED STATES PATENT AND TRADEMARK OFFICE
CERTIFICATE OF CORRECTION

| | | |
|---|---|---|
| PATENT NO. | : 7,064,052 B2 | Page 1 of 1 |
| APPLICATION NO. | : 10/133390 | |
| DATED | : June 20, 2006 | |
| INVENTOR(S) | : Ronald A. Weimer et al. | |

It is certified that error appears in the above-identified patent and that said Letters Patent is hereby corrected as shown below:

In the Title: item 54 and column 1

"METHOD OF PROCESSING A TRANSISTOR GATE DIELECTRIC FILM WITH STEM" should read --METHOD OF PROCESSING A TRANSISTOR GATE DIELECTRIC FILM WITH STEAM--.

Signed and Sealed this

Twenty-first Day of November, 2006

JON W. DUDAS
*Director of the United States Patent and Trademark Office*